United States Patent
Xie et al.

(10) Patent No.: US 12,255,204 B2
(45) Date of Patent: Mar. 18, 2025

(54) VERTICAL FET REPLACEMENT GATE FORMATION WITH VARIABLE FIN PITCH

(71) Applicant: INTERNATIONAL BUSINESS MACHINES CORPORATION, Armonk, NY (US)

(72) Inventors: Ruilong Xie, Niskayuna, NY (US); Yao Yao, Albany, NY (US); Andrew M. Greene, Slingerlands, NY (US); Veeraraghavan S. Basker, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 123 days.

(21) Appl. No.: 17/479,145

(22) Filed: Sep. 20, 2021

(65) Prior Publication Data
US 2023/0086960 A1 Mar. 23, 2023

(51) Int. Cl.
*H01L 27/088* (2006.01)
*H01L 21/8234* (2006.01)
(Continued)

(52) U.S. Cl.
CPC .... *H01L 27/088* (2013.01); *H01L 21/823437* (2013.01); *H01L 21/823487* (2013.01); *H01L 29/42392* (2013.01); *H01L 29/66545* (2013.01)

(58) Field of Classification Search
CPC ..... H01L 21/823487; H01L 21/823437; H01L 21/823885; H01L 27/088; H01L 27/2454; H01L 27/11556; H01L 27/11582; H01L 29/7827; H01L 29/66666; H01L 29/1037; H01L 29/66787; H01L 29/78642; H01L 29/66545; H01L 29/42392; H10B 63/34; H10B 41/27; H10B 43/27
See application file for complete search history.

(56) References Cited

U.S. PATENT DOCUMENTS 9,269,629 B2   2/2016 Cheng et al.
9,761,728 B1   9/2017 Cheng et al.
(Continued)

FOREIGN PATENT DOCUMENTS

| CN | 108735816 A | 11/2018 |
|---|---|---|
| CN | 109643732 A | 4/2019 |
| CN | 113224162 A | 8/2021 |

OTHER PUBLICATIONS

International Search Report from PCT/CN2022/107920 dated Oct. 26, 2022, 9 pages.

*Primary Examiner* — Michael M Trinh
(74) *Attorney, Agent, or Firm* — Tutunjian & Bitetto, P.C.; Samuel Waldbaum (57) ABSTRACT

A semiconductor structure includes a first set of fins and a second set of fins, a dielectric pillar disposed between the first set of fins and the second set of fins, a bottom source/drain (S/D) region directly contacting a bottom surface of the first and second set of fins, and a top S/D region directly contacting a top surface of the first and second set of fins. A high-k metal gate (HKMG) is disposed between fins of the first set of fins and between fins of the second set of fins. The HKMG directly contacts sidewalls of the dielectric pillar. A width of the HKMG between the first set of fins is equal to a width of the HKMG between the second set of fins.

7 Claims, 12 Drawing Sheets

(51) Int. Cl.
*H01L 29/423* (2006.01)
*H01L 29/66* (2006.01)

(56) References Cited

U.S. PATENT DOCUMENTS

| | | |
|---|---|---|
| 9,780,197 B1 | 10/2017 | Xie et al. |
| 9,799,570 B1 | 10/2017 | Cheng |
| 9,806,153 B1 | 10/2017 | Cheng et al. |
| 9,859,166 B1* | 1/2018 | Cheng ............. H01L 21/823487 |
| 9,929,256 B2 | 3/2018 | Cheng et al. |
| 10,256,328 B2 | 4/2019 | Cheng et al. |
| 10,361,125 B2 | 7/2019 | Xu et al. |
| 10,658,481 B1 | 5/2020 | Zhang et al. |
| 2016/0293756 A1 | 10/2016 | Liu et al. |
| 2018/0122800 A1* | 5/2018 | Cheng ................. H01L 29/7827 |
| 2018/0130895 A1* | 5/2018 | Park ................ H01L 21/823456 |
| 2018/0315850 A1* | 11/2018 | Liu ....................... H01L 29/165 |
| 2018/0350691 A1* | 12/2018 | Cheng ................ H01L 29/0649 |
| 2019/0252260 A1* | 8/2019 | Reznicek ........ H01L 21/823425 |
| 2020/0144265 A1* | 5/2020 | Bao .................... H01L 29/6653 |

* cited by examiner

VERTICAL FET REPLACEMENT GATE FORMATION WITH VARIABLE FIN PITCH

BACKGROUND

The present invention relates generally to semiconductor devices, and more specifically, to forming a vertical field-effect-transistor (VFET) replacement meal gate (RMG) with a variable fin pitch and self-aligned isolation.

Semiconductor devices are used in a variety of electronic applications, such as personal computers, cell phones, digital cameras, and other electronic equipment. Semiconductor devices are usually fabricated by sequentially depositing insulating or dielectric layers, conductive layers, and semi-conductive layers of material over a semiconductor substrate, and patterning the various material layers using lithography to form circuit components and elements thereon. The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node. With the increased demands for miniaturization, higher speed, greater bandwidth, lower power consumption, and lower latency, chip layout has become more complicated and difficult to achieve in the production of semiconductor dies.

SUMMARY

In accordance with an embodiment, a semiconductor structure is provided. The semiconductor structure includes a first set of fins and a second set of fins, a dielectric pillar disposed between the first set of fins and the second set of fins, a bottom source/drain (S/D) region directly contacting a bottom surface of the first and second set of fins, and a top S/D region directly contacting a top surface of the first and second set of fins.

In accordance with another embodiment, a method is provided for forming a semiconductor device. The method includes forming a first set of fins and a second set of fins, forming a sacrificial material adjacent the first and second set of fins, separating the first set of fins from the second set of fins by a dielectric pillar to generate self-aligned isolation, recessing the sacrificial material to define a recessed sacrificial material gate pillar, successively forming a top spacer, a top source/drain (S/D) region, and an epi cap, forming a trench opening to expose the recessed sacrificial material, removing the recessed sacrificial material to define openings, and forming a high-k metal gate (HKMG) within the openings.

In accordance with yet another embodiment, a semiconductor structure is provided. The semiconductor structure includes a first set of fins defining a plurality of first fins having a first pitch therebetween, a second set of fins defining a plurality of second fins having a second pitch therebetween, a dielectric pillar disposed between the first set of fins and the second set of fins, and a high-k metal gate (HKMG) disposed between the first set of fins and between the second set of fins. A third pitch is defined between a first fin of the plurality of first fins adjacent the dielectric pillar and a second fin of the plurality of second fins adjacent the dielectric pillar.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for forming vertical field-effect-transistors (VFETs) with variable fin pitch so that self-aligned isolation can be formed at wider FIN-to-FIN space between different devices. Thus, the exemplary embodiments focus on self-aligned isolation formation for VFETs. The device-to-device separation is larger to accommodate a work function metal (WFM) and isolation without impacting density. As a result, every fin views the same WFM stack.

Vertical FET devices employ doped source and drain regions, where a doped source/drain region for a vertical FET can be formed on top of a vertical semiconductor fin, and where a doped source/drain region can be formed underneath the vertical semiconductor fin. In addition, a vertical source/drain (S/D) contact of the vertical FET device can be disposed adjacent to the vertical semiconductor fin as an elongated bar contact. The vertical S/D contact can be formed to make contact to an upper surface of the underlying S/D region, and can be disposed at a sufficient distance from the vertical semiconductor fin so that the vertical S/D contact does not electrically short to the vertical metal gate structure formed on the vertical semiconductor fin. What this effectively means is that the current path through the doped S/D region between a vertical contact/S/D region interface and a S/D region/channel junction interface, can be constructed entirely of doped semiconductor material. This current path through the doped S/D region, if relatively long, can result in increased series resistance of the S/D, which in turn reduces a total drive current of the vertical FET device. Thus, contact resistance is a factor as transistor device scaling continues beyond the 5 nanometer (nm) technology node. Additionally, current schemes for VFETs are not ideal because the high-k/metal gate will see top S/D thermal budget, and, thus, there is a risk in not meeting thickness scaling for $T_{inv}$ and voltage threshold (Vt) requirements.

Embodiments in accordance with the present invention provide methods and devices employing techniques for fabricating or constructing VFETs with variable fin pitch so that self-aligned isolation can be formed at wider FIN-to-FIN space between different devices to further reduce contact resistance, enable closer positioning of fins between devices, and meet $T_{inv}$ and Vt requirements. Closer positioning of fins between devices is enabled by the formation of a variable FIN pitch VFET with a robust replacement metal gate (RMG) process with self-aligned isolation (e.g., conformal dielectric pillars).

Examples of semiconductor materials that can be employed in forming such structures include silicon (Si), germanium (Ge), silicon germanium alloys (SiGe), carbon doped silicon (Si:C), carbon doped silicon germanium carbide (SiGe:C), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
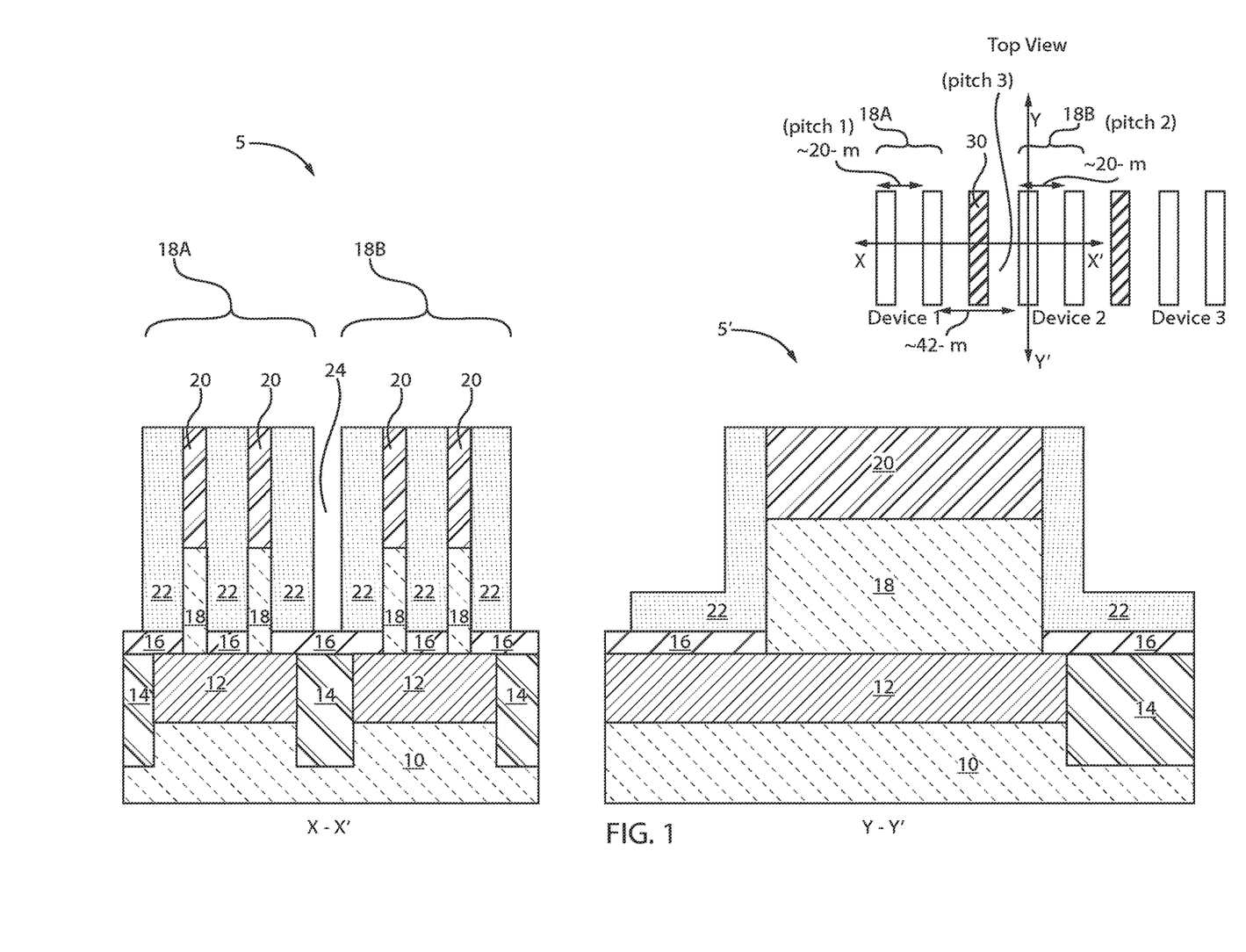
FIG. 1 is a cross-sectional view of a semiconductor structure including a plurality of fins over a semiconductor substrate, the plurality of fins formed adjacent a sacrificial liner, in accordance with an embodiment of the present invention.

FIG. 1 is a cross-sectional view of a semiconductor structure including a plurality of fins over a semiconductor substrate, the plurality of fins formed adjacent a sacrificial liner, in accordance with an embodiment of the present invention.

In structure 5, a plurality of fins 18 are formed over a substrate 10. A hardmask 20 is formed over the plurality of fins 18. The plurality of fins 18 can be in direct contact with source/drain (S/D) regions 12 (or bottom S/D regions 12) formed within the substrate 10. Shallow trench isolation (STI) regions 14 can separate the S/D regions 12 from each other. Additionally, a bottom spacer 16 can be formed adjacent the bottom portion of the plurality of fins 18. The bottom spacer 16 directly contacts a top surface of the bottom S/D regions 12 and the STI regions 14.

The plurality of fins 18 directly contact a sacrificial liner 22. In one example, the sacrificial liner 22 can be, e.g., a thin layer of silicon dioxide ($SiO_2$) followed by conformal amorphous silicon germanium (a-SiGe) (bi-layer deposition).

The plurality of fins 18 can include a first set of fins 18A and a second set of fins 18B. The first set of fins 18A can be referred to as a first device and the second set of fins 18B can be referred to as a second device, as shown in the top view.

The first set of fins 18A are separated from the second set of fins 18B by an opening 24.

Structure 5' illustrates the Y-Y' view.

Figure 3:
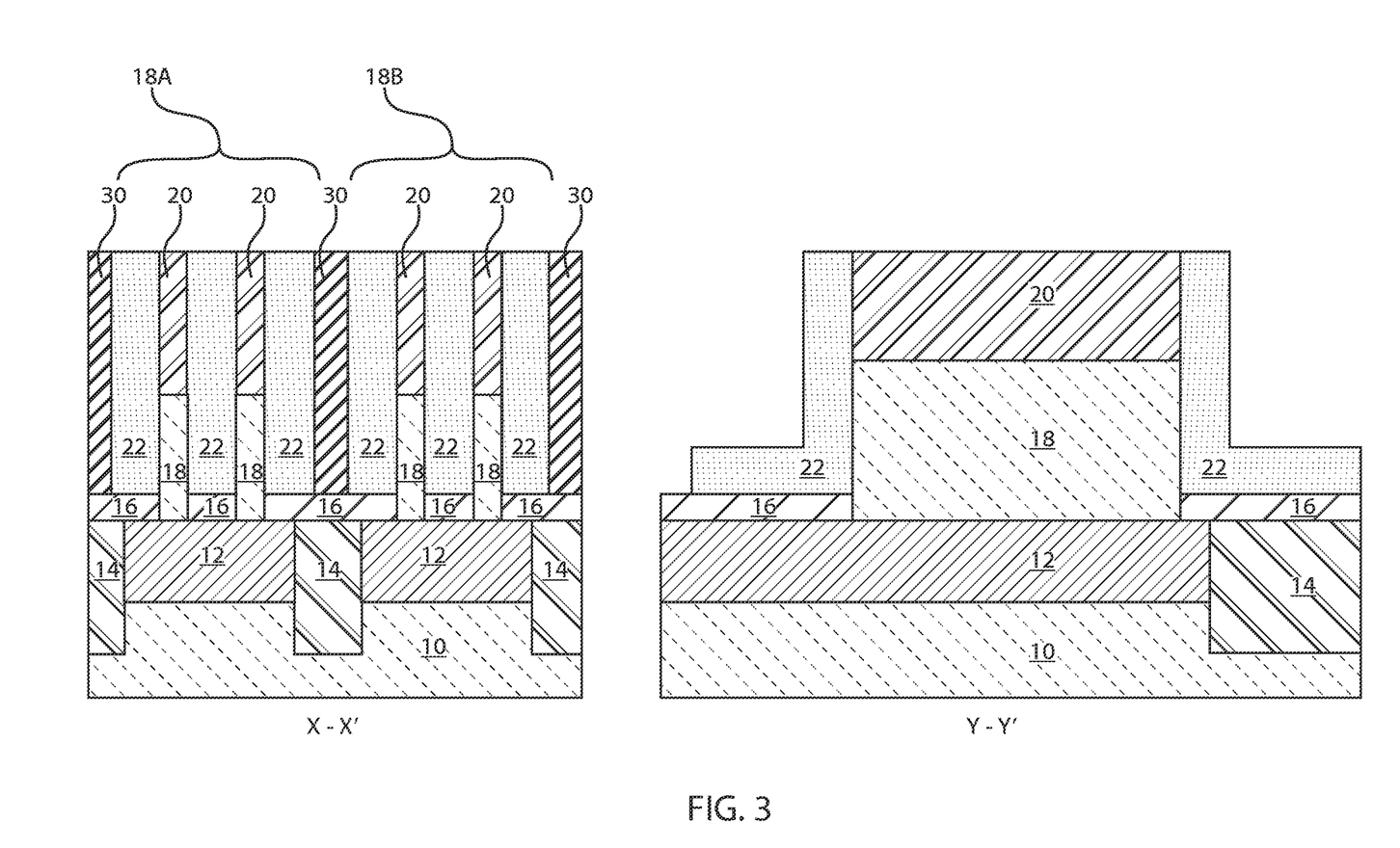
FIG. 3 is a cross-sectional view of the semiconductor structure of FIG. 2 where the conformal dielectric liner is etched back to form a conformal dielectric pillar, in accordance with an embodiment of the present invention.

The top view illustrates the X-X' axis and the Y-Y' axis. The X-X' axis extends horizontally through all the fins, whereas the Y-Y' axis extends vertically through a fin. The first set of fins 18A and the second set of fins 18B are illustrated. The first set of fins 18A are separated from the second set of fins 18B by a conformal dielectric pillar 30 (FIG. 3). The pitch (first pitch) between the first set of fins 18A can be, e.g., 20 nm (or 15 to 30 nm). The pitch (second pitch) between the second set of fins 18B can be, e.g., 20 nm (or 15 to 30 nm). In other exemplary embodiments, the first and second pitches can be different from each other. Further, the pitch between a fin of the first set of fins 18A (adjacent the conformal dielectric pillar 30) and a fin of the second set of fins 18B (adjacent the conformal dielectric pillar 30) can be defined as a third pitch of, e.g., 42 nm (or 32 to 60 nm). Thus, the first device and the second device can have variable fin pitches. The conformal dielectric pillar 30 (or isolation structure) is thus formed substantially in the middle between fins with wider pitch (e.g., between fin of first set of fins and fin of second set of fins).

Also, the first set of fins 18A have a common bottom S/D region 12 and the second set of fins 18B have a common bottom S/D region 12. Thus, there is a merged bottom S/D region 12 for fins with the smaller pitch. The fins with the wider pitch do not share a common S/D region. For example, the rightmost fin of the first set of fins 18A does not share a common S/D region with the leftmost fin of the second set of fins 18B.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, Al$_2$O$_3$, SiO$_2$, GaAs, SiC, or SiGe. The substrate 10 can also have multiple material layers. In some embodiments, the substrate 10 includes a semiconductor material including, but not necessarily limited to, silicon (Si), silicon germanium (SiGe), Si:C (carbon doped silicon), carbon doped silicon germanium (SiGe:C), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials.

Bottom spacer 16 can include any one or more of SiN, SiBN, SiCN and/or SiBCN films.

Other non-limiting examples of materials for the bottom spacers 16 include oxides (e.g., silicon oxide), dielectric nitrides (e.g., silicon nitride), dielectric oxynitrides, or any combination thereof. The bottom spacers 16 are initially formed as a layer over the substrate 10 by a deposition process, for example, chemical vapor deposition (CVD) or physical vapor deposition (PVD). In some embodiments, the bottom spacer 16 is formed by a directional deposition (e.g., high density plasma chemical vapor deposition) followed by an etch-back process.

The plurality of fins 18 can be formed from a semiconductor material including, but not limited to Si, strained Si, Si:C, SiGe, SiGe:C, Si alloys, Ge, Ge alloys, GaAs, InAs, InP, as well as other III/V and II/VI compound semiconductors. The plurality of fins 18 can be etched by employing, e.g., a reactive ion etch (RIE) or the like. In other embodiments, the etching can include a dry etching process such as, for example, reactive ion etching, plasma etching, ion etching or laser ablation. The etching can further include a wet chemical etching process in which one or more chemical etchants are employed to remove portions of the layers.

The hardmask 20 can be manufactured of silicon nitride (SiN), deposited using, for example, low pressure chemical vapor deposition (LPCVD). In other example embodiments, the hardmask 20 can include, but is not limited to, hafnium oxide (HfO$_2$) or tantalum nitride (TaN) or titanium nitride (TiN). In some embodiments, the hardmask 20 can include multiple layers, for example, silicon nitride on top of silicon oxide. The hardmask 20 can be formed by any suitable patterning technique, including but not limited to, sidewall image transfer (SIT), self-aligned double patterning (SADP), self-aligned quadruple patterning (SAQP), lithography followed by etching, etc.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 2:
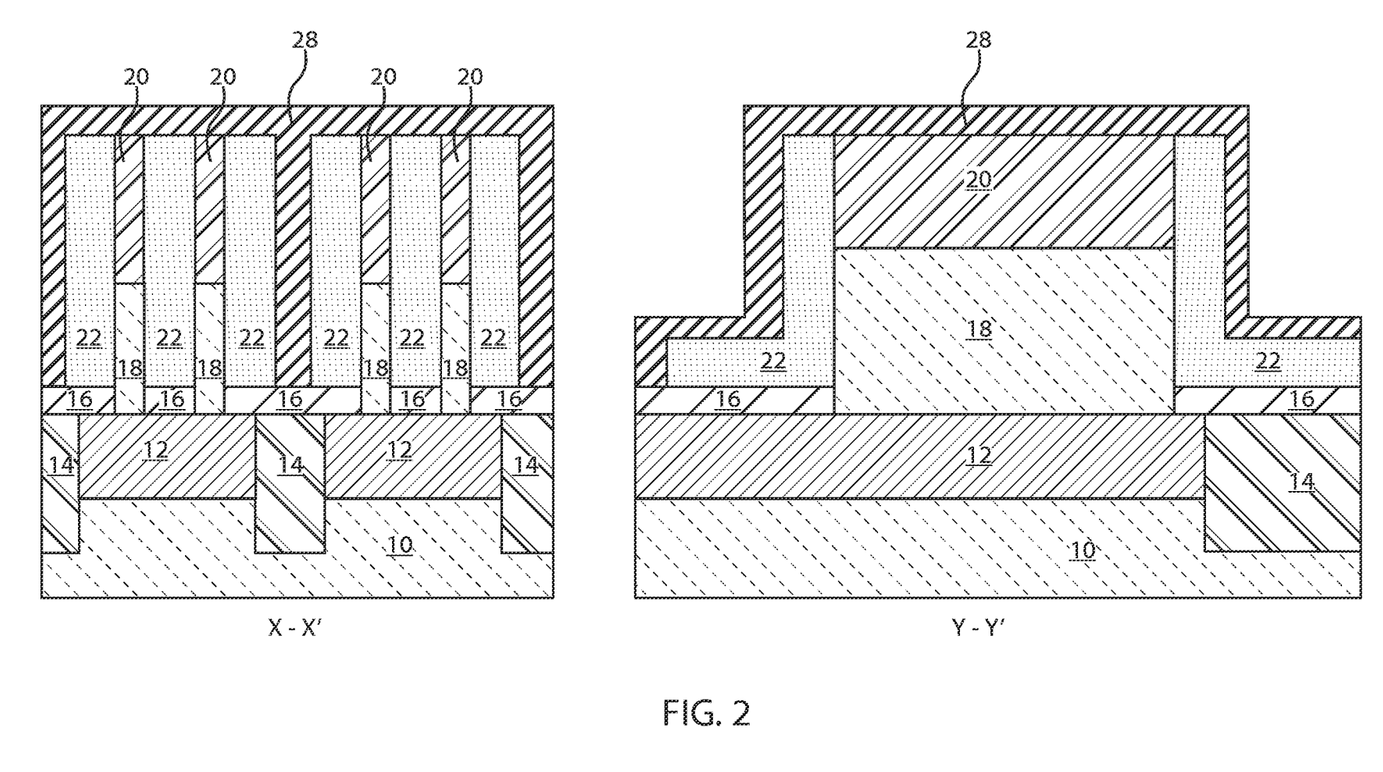
FIG. 2 is a cross-sectional view of the semiconductor structure of FIG. 1 where a conformal dielectric liner is deposited, in accordance with an embodiment of the present invention.

FIG. 2 is a cross-sectional view of the semiconductor structure of FIG. 1 where a conformal dielectric liner is deposited, in accordance with an embodiment of the present invention.

A conformal dielectric 28 is deposited over the plurality of fins 18 with the hardmask 20. In one example, the conformal dielectric 28 can be, e.g., silicon carbide (SiC).

FIG. 3 is a cross-sectional view of the semiconductor structure of FIG. 2 where the conformal dielectric liner is etched back to form a conformal dielectric pillar, in accordance with an embodiment of the present invention.

The conformal dielectric 28 is isotropically etched back to expose a top surface of the sacrificial liner 22 and to define conformal dielectric pillars 30. In one example, a conformal dielectric pillar 30 is formed between the first set of fins 18A and the second set of fins 18B.

Figure 4:
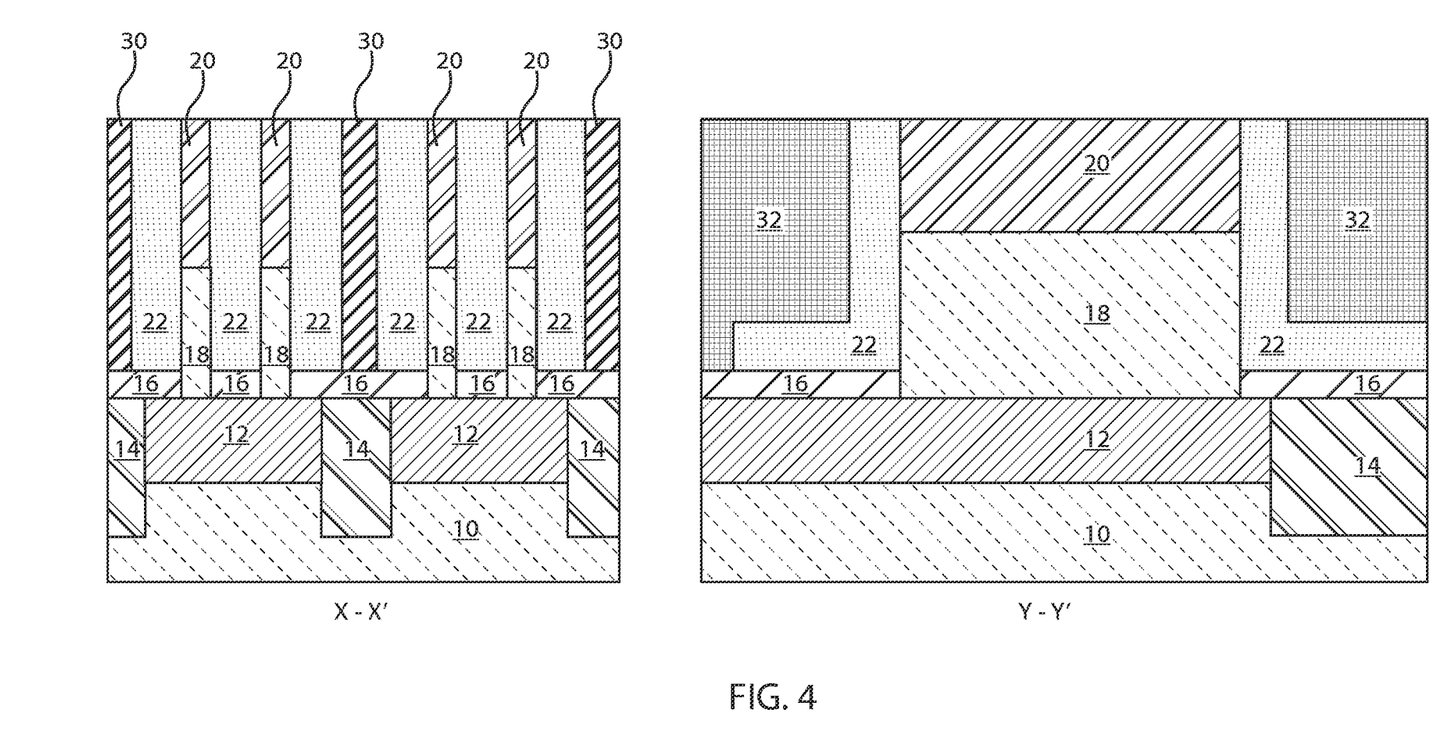
FIG. 4 is a cross-sectional view of the semiconductor structure of FIG. 3 where an inter-layer dielectric (ILD) is deposited, in accordance with an embodiment of the present invention.

FIG. 4 is a cross-sectional view of the semiconductor structure of FIG. 3 where an inter-layer dielectric (ILD) is deposited, in accordance with an embodiment of the present invention.

An ILD 32 is deposited. The ILD 32 is shown along the Y-Y' view.

The ILD 32 can include any materials known in the art, such as, for example, porous silicates, carbon doped oxides, silicon dioxides, silicon nitrides, silicon oxynitrides, or other dielectric materials. The ILD 32 can be formed using any method known in the art, such as, for example, chemical vapor deposition, plasma enhanced chemical vapor deposition, atomic layer deposition, or physical vapor deposition. The ILD 32 can have a thickness ranging from about 25 nm to about 200 nm. After ILD 32 deposition, a CMP process is followed to planarize the ILD to FIN hardmask 20.

Figure 5:
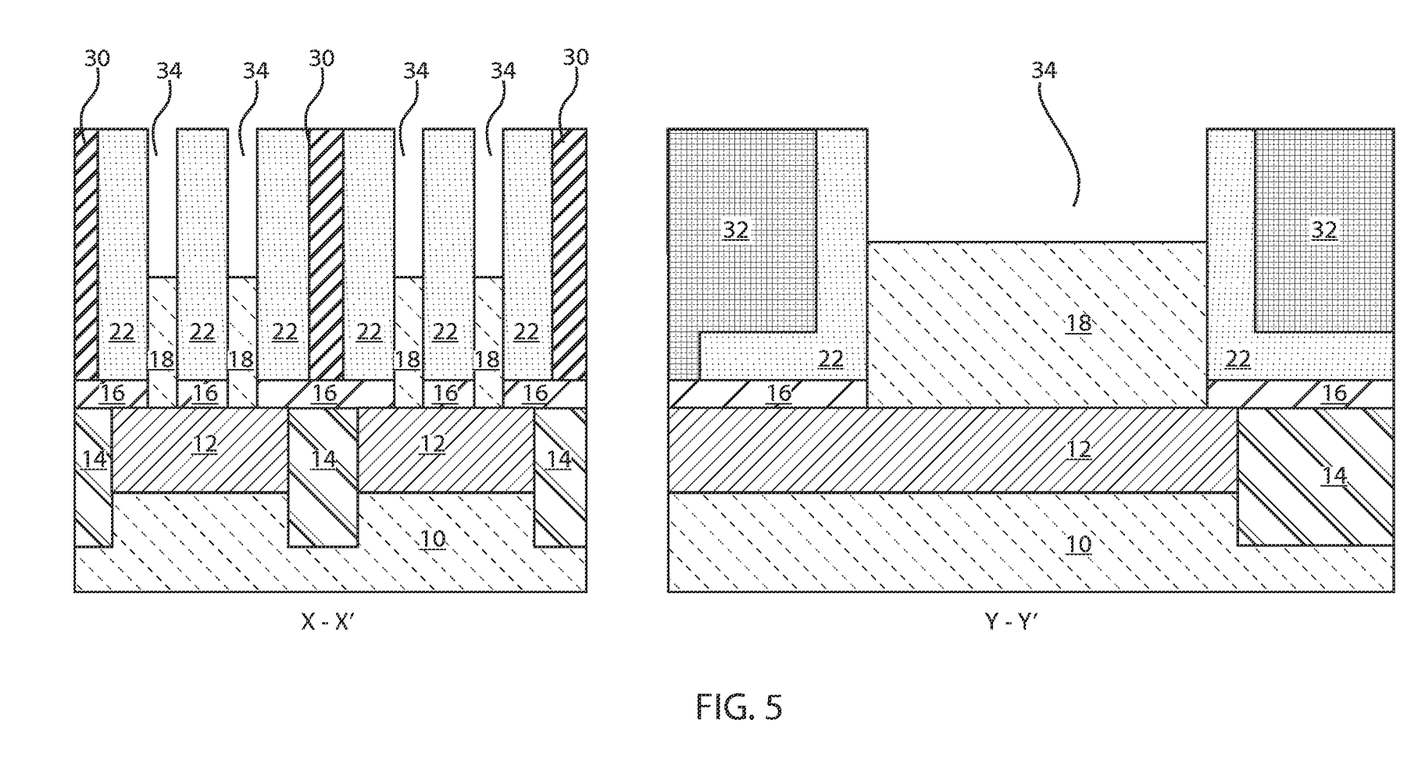
FIG. 5 is a cross-sectional view of the semiconductor structure of FIG. 4 where the hardmask is removed, in accordance with an embodiment of the present invention.

FIG. 5 is a cross-sectional view of the semiconductor structure of FIG. 4 where the hardmask is removed, in accordance with an embodiment of the present invention.

The hardmask 20 is removed to expose a top surface of the plurality of fins 18. The removal of the hardmask 20 results in the formation of openings 34. The conformal dielectric pillars 30 remain intact.

Figure 6:
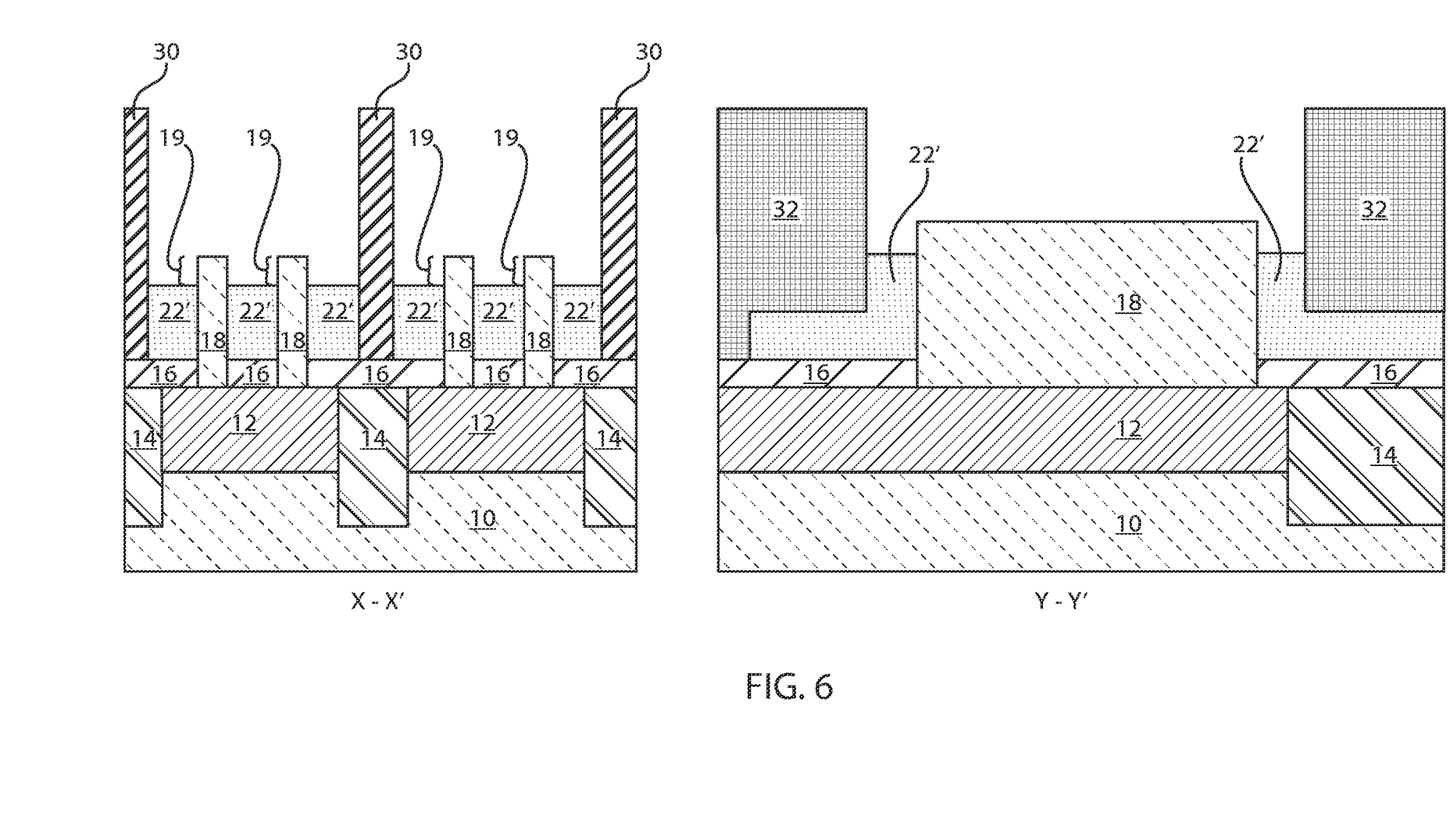
FIG. 6 is a cross-sectional view of the semiconductor structure of FIG. 5 where the sacrificial liner is recessed to expose a top portion of the plurality of fins, in accordance with an embodiment of the present invention.

FIG. 6 is a cross-sectional view of the semiconductor structure of FIG. 5 where the sacrificial liner is recessed to expose a top portion of the plurality of fins, in accordance with an embodiment of the present invention.

The bi-layer sacrificial liner 22 is recessed to expose a top portion 19 of the plurality of fins 18. The sacrificial liner 22 is recessed such that sacrificial liner portions 22' remain between the plurality of fins 18.

Recessing can be performed by vapor phased HCl dry etch or wet etch processing to recess the sacrificial SiGe layer first. In one example, a vertical wet etch can be employed to define the channel length. Non-limiting examples of wet etch processes that can be used to form the recess include hydrogen peroxide (H$_2$O$_2$), potassium hydroxide (KOH), ammonium hydroxide (ammonia), tetramethylammonium hydroxide (TMAH), hydrazine, or ethylene diamine pyrocatechol (EDP), or any combination thereof. After that, another wet or dry etch process is used to remove the thin SiO$_2$ liner, e.g., by DHF wet clean or SiCoNi oxide removal.

Figure 7:
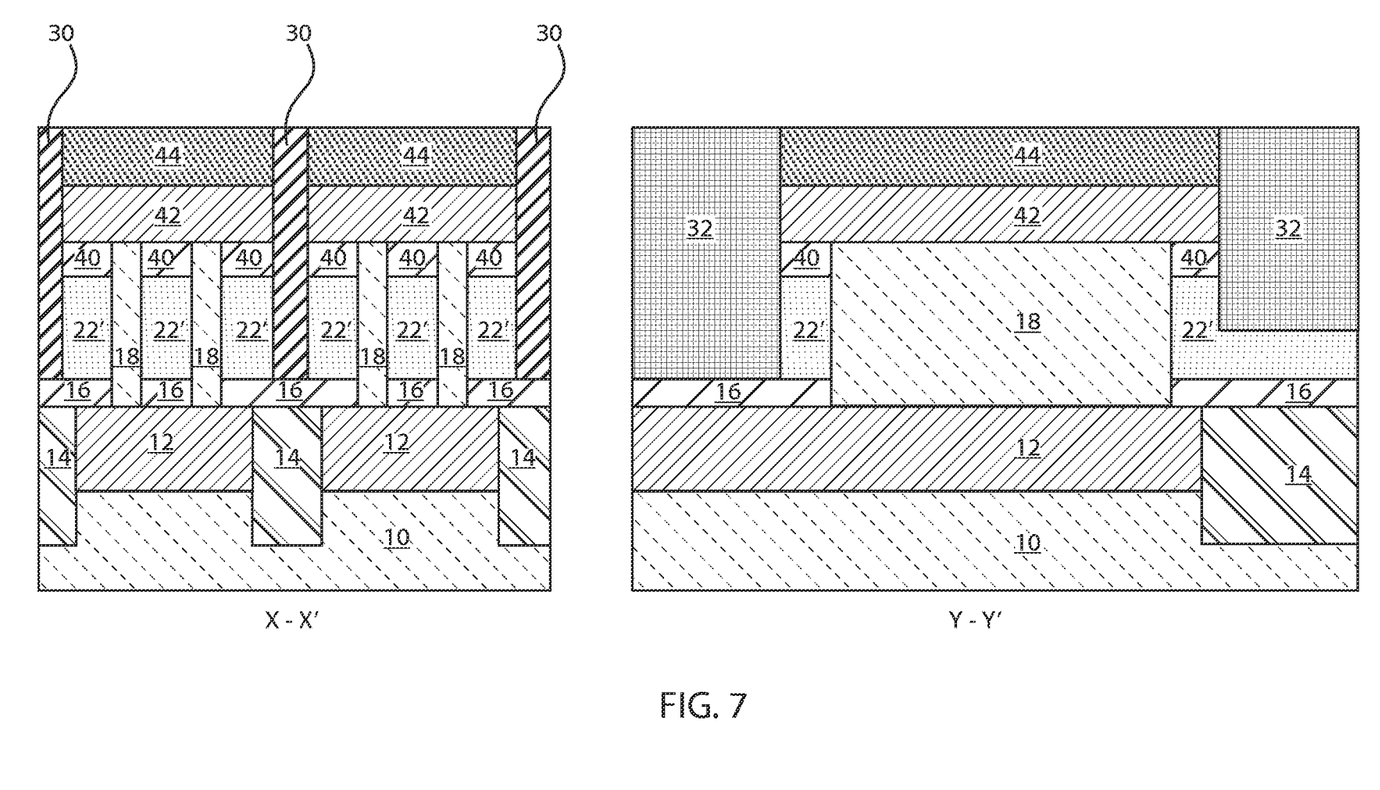
FIG. 7 is a cross-sectional view of the semiconductor structure of FIG. 6 where a top spacer, a top source/drain region, and a top epi cap are deposited, in accordance with an embodiment of the present invention.

FIG. 7 is a cross-sectional view of the semiconductor structure of FIG. 6 where a top spacer, a top source/drain region, and a top epi cap are deposited, in accordance with an embodiment of the present invention.

A top spacer 40 is deposited followed by a top S/D region 42, and then followed by a top epi cap 44. The top spacer 40 is formed adjacent the top portion 19 of the plurality of fins 18. The top S/D region 42 is formed over the plurality of fins 18, such that the S/D region 42 directly contacts top surfaces of the plurality of fins 18.

The sidewalls of the top spacer 40, the sidewalls of the top S/D region 42, and the sidewalls of the top epi cap 44 directly contact sidewalls of the conformal dielectric pillars 30.

Top spacer 40 can include any one or more of SiN, SiBN, SiCN and/or SiBCN films.

Other non-limiting examples of materials for the top spacers 40 include oxides (e.g., silicon oxide), dielectric nitrides (e.g., silicon nitride), dielectric oxynitrides, or any combination thereof. The top spacers 40 are initially formed as a layer over the substrate 10 by a deposition process, for example, ALD, chemical vapor deposition (CVD) or physical vapor deposition (PVD). In some embodiments, the top spacer 40 is formed by a ALD deposition process to pinch-off the cavities formed over the recessed sacrificial liner 22, followed by an isotropic etch-back process to remove the top spacer liner everywhere except the pinched-off regions.

It is to be understood that the term "source/drain region" as used herein means that a given source/drain region can be either a source region or a drain region, depending on the application.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and can be conducted at higher or lower temperatures as needed.

Figure 8:
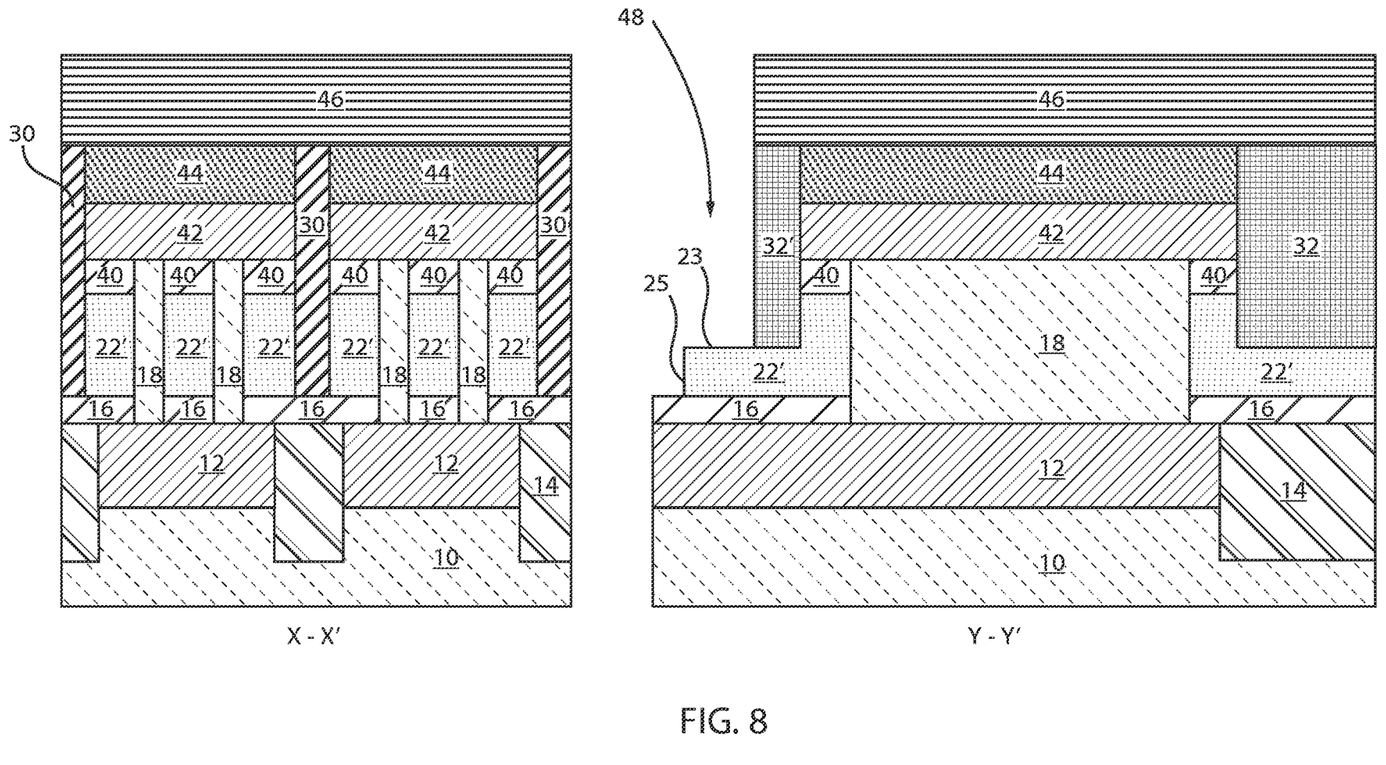
FIG. 8 is a cross-sectional view of the semiconductor structure of FIG. 7 where a top replacement metal gate (RMG) trench is opened, in accordance with an embodiment of the present invention.

FIG. 8 is a cross-sectional view of the semiconductor structure of FIG. 7 where a top replacement metal gate (RMG) trench is opened, in accordance with an embodiment of the present invention.

An organic planarization layer (OPL) 46 is deposited and a trench opening 48 is defined by litho and patterning process such that a top surface of the bottom spacer 16 is exposed, such that sidewalls 25 and top surfaces 23 of the sacrificial liner portions 22' are exposed. Additionally, the ILD 32 can be patterned to ILD section 32'.

The thickness of the OPL 46 can be in a range from about 50 nm to about 300 nm. In one example, the thickness of the OPL 46 is about 100 nm. The OPL layer 46 can include an organic material, such as a polymer.

Figure 9:
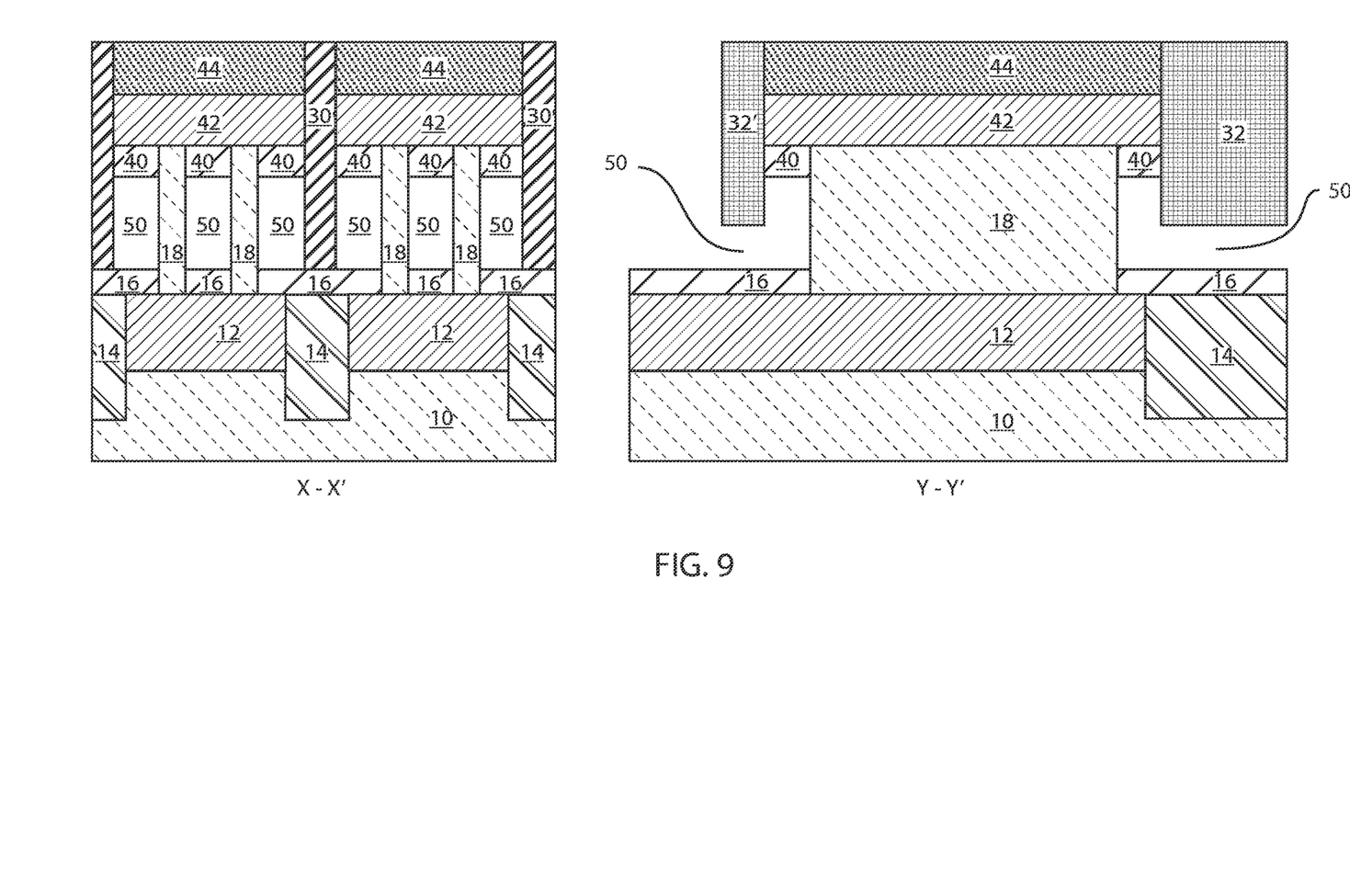
FIG. 9 is a cross-sectional view of the semiconductor structure of FIG. 8 where the sacrificial gate is removed to create openings between the plurality of fins, in accordance with an embodiment of the present invention.

FIG. 9 is a cross-sectional view of the semiconductor structure of FIG. 8 where the sacrificial gate is removed to create openings between the plurality of fins, in accordance with an embodiment of the present invention.

The sacrificial liner portions 22' are completely removed to create gaps or openings 50.

Removal can be performed by wet etch processing. The vertical height of the void left behind when sacrificial liner 22' is removed defines the gate length of the devices. Non-limiting examples of wet etch processes that can be used to remove the sacrificial bi-layer liner 22' include hydrogen peroxide ($H_2O_2$), potassium hydroxide (KOH), ammonium hydroxide (ammonia), tetramethylammonium hydroxide (TMAH), hydrazine, or ethylene diamine pyrocatechol (EDP), or any combination thereof followed by a DHF wet clean.

Figure 10:
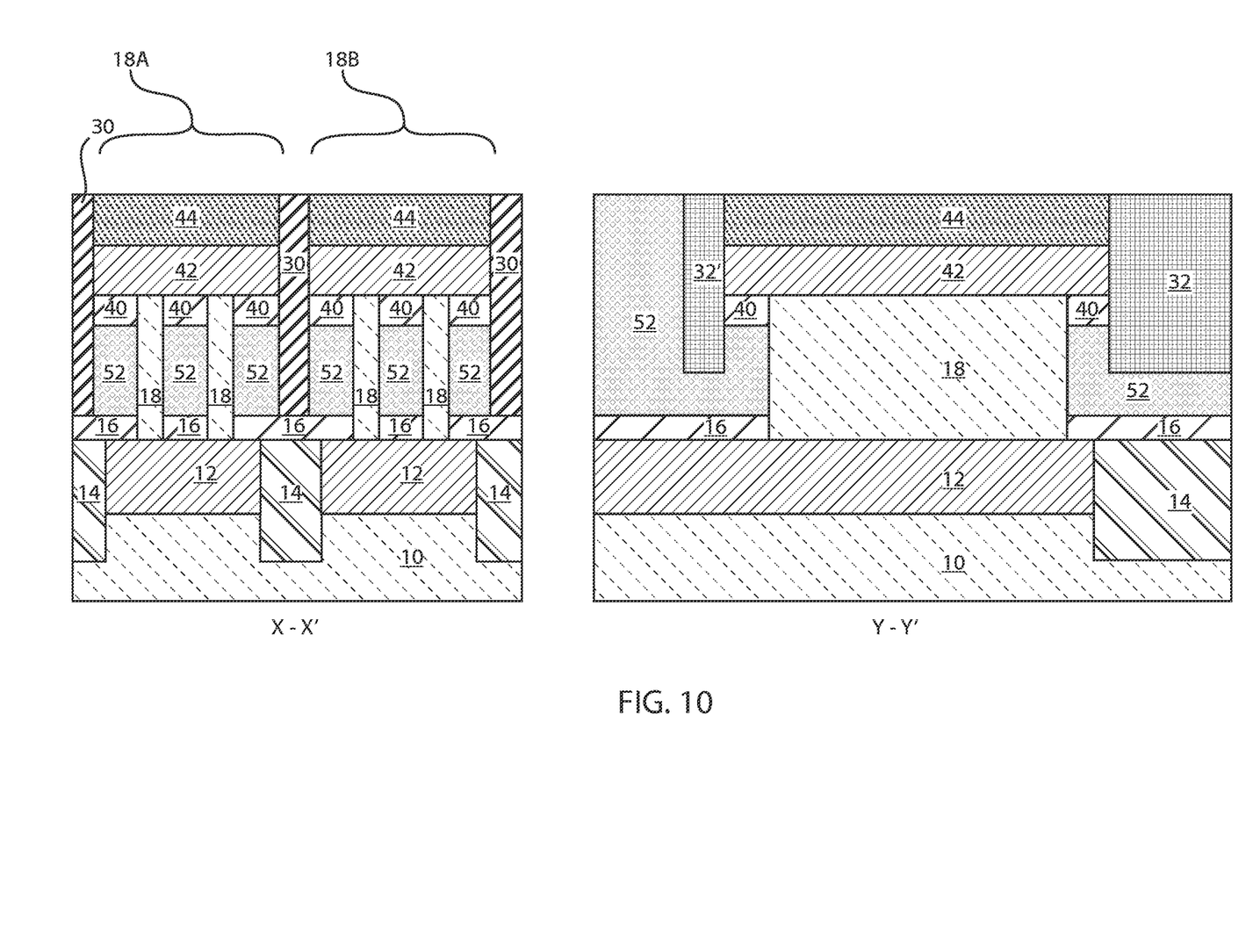
FIG. 10 is a cross-sectional view of the semiconductor structure of FIG. 9 where replacement gate (RMG) takes place (formation of high-k metal gate (HKMG)), in accordance with an embodiment of the present invention.

FIG. 10 is a cross-sectional view of the semiconductor structure of FIG. 9 where replacement gate (RMG) takes place (formation of high-k metal gate (HKMG)), in accordance with an embodiment of the present invention.

A HKMG gate stack 52 is deposited within the gaps or openings 50. The conformal dielectric pillars 30 extend above a top surface of the HKMG gate stacks 52.

The RMG 52 is disposed between fins of the first set of fins 18A and between fins of the second set of fins 18B. The RMGs 52 directly contact sidewalls of the conformal dielectric pillar 30. A width 76 (FIG. 12) of the RMG 52 between the first set of fins 18A is equal to a width of the RMG 76 between the second set of fins 18B. A width 76 of the RMG 52 between a fin of the first set of fins 18A and the conformal dielectric pillar 30 is equal to a width 76 of the RMG 52 between a fin of the second set of fins 18B and the conformal dielectric pillar 30.

The RMG 52 includes HKMG materials. Example of high-k dielectric includes $HfO_2$, HfSiOx, HfAlOx, $ZrO_2$, TaOx, etc, example of metal gates includes work function metals, such as TiN, TiAlC, TiC, TaN, etc., and optionally conductive metal fills such as W, Al, etc. The HKMG deposition process is highly conformal and can be achieved using atomic layer deposition process (ALD).

Figure 11:
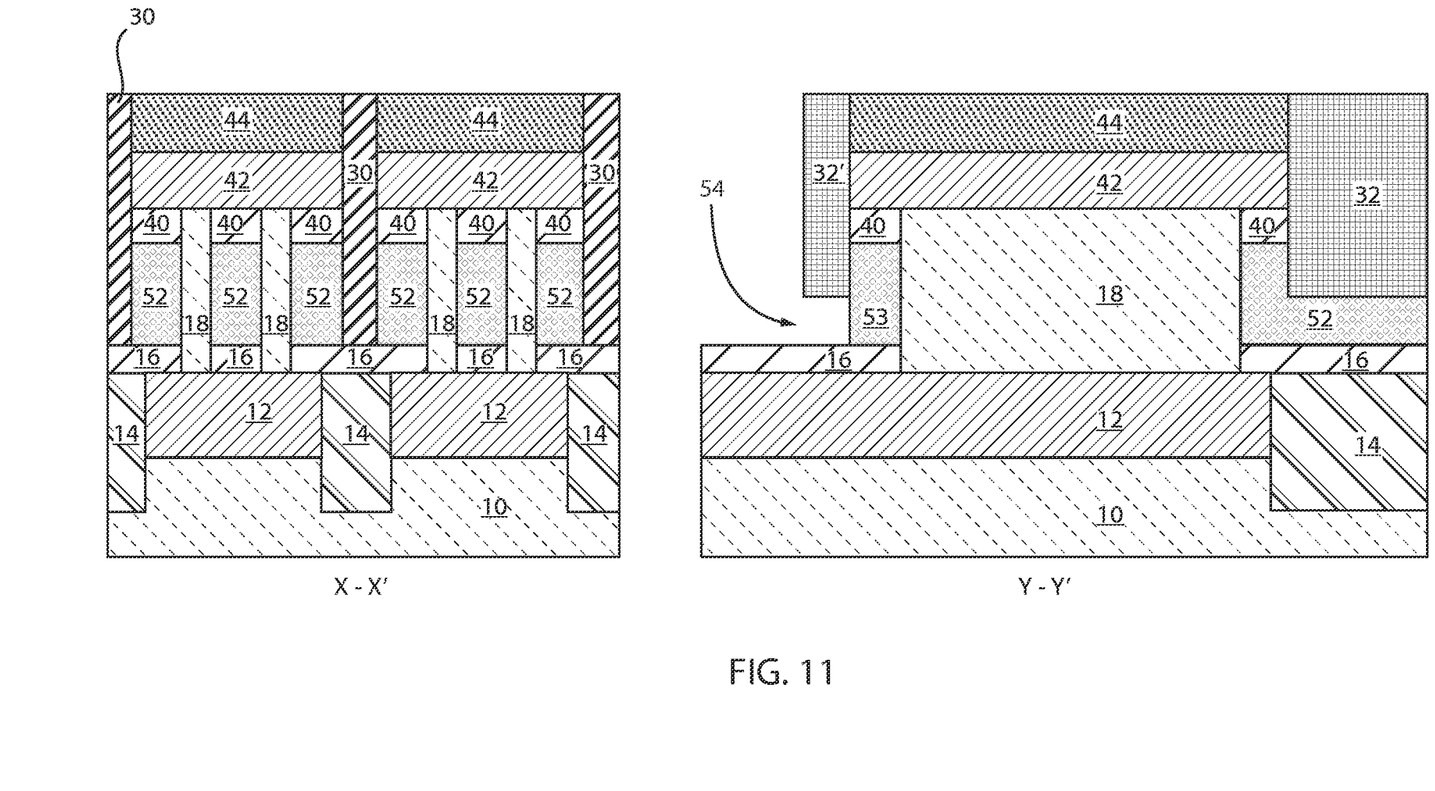
FIG. 11 is a cross-sectional view of the semiconductor structure of FIG. 10 where a metal recess is performed, in accordance with an embodiment of the present invention.

FIG. 11 is a cross-sectional view of the semiconductor structure of FIG. 10 where a metal recess is performed, in accordance with an embodiment of the present invention.

A metal recess occurs where a portion of RMG 52 is removed such that a RMG segment 53 remains adjacent the fin 18. An opening is created under the ILD section 32'.

Figure 12:
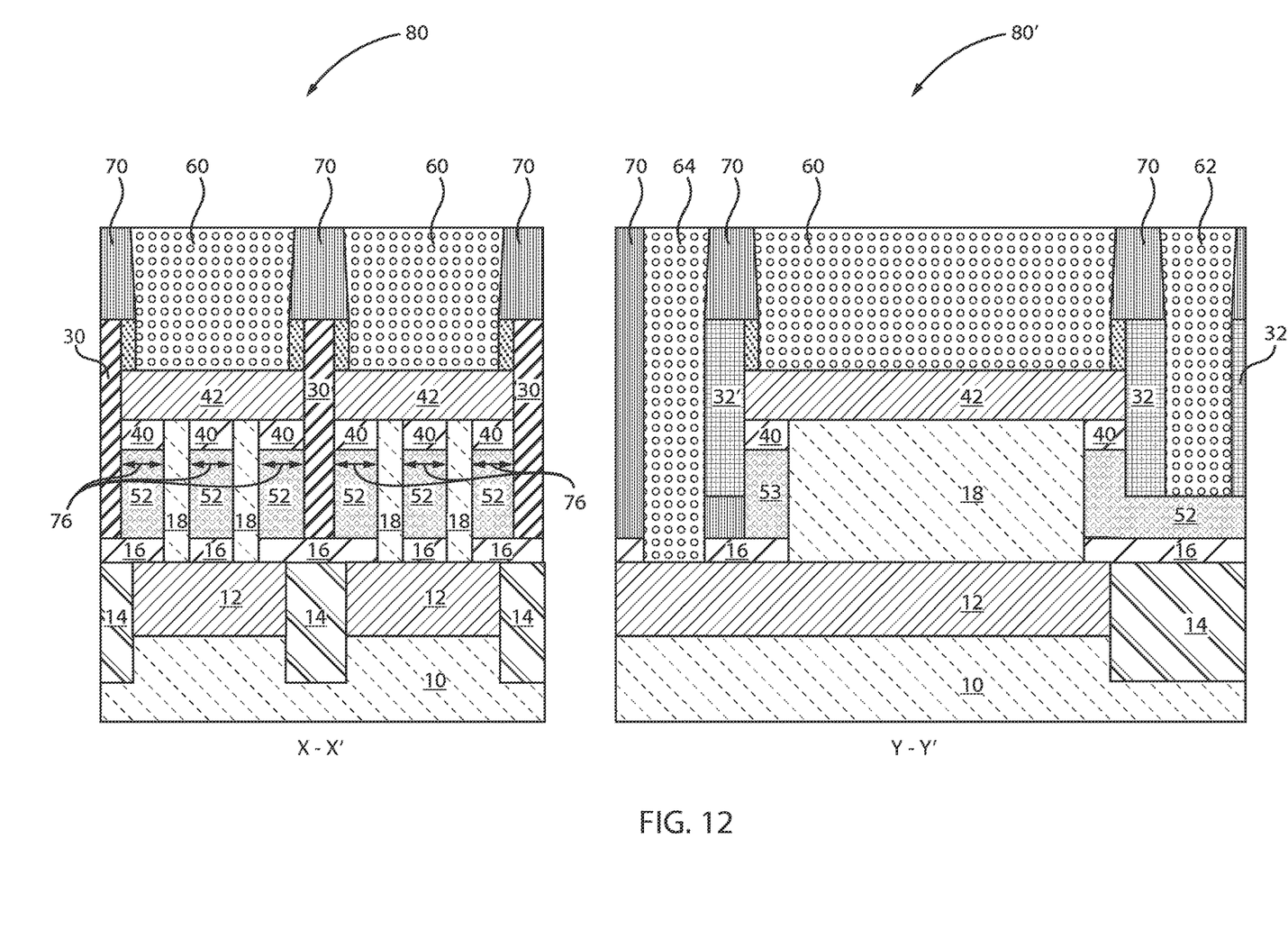
FIG. 12 is a cross-sectional view of the semiconductor structure of FIG. 11 where contacts are formed, in accordance with an embodiment of the present invention.

FIG. 12 is a cross-sectional view of the semiconductor structure of FIG. 11 where contacts are formed, in accordance with an embodiment of the present invention.

In final structures 80, 80', contacts 60, 62, 64 are formed. CA contact 60 is formed to the top surface of the top S/D region 40. CB contact 62 is formed to a top surface of the RMG 52. TS contact 64 is formed to a top surface of the bottom S/D region 12. A further ILD 70 is deposited adjacent the contacts 60, 62, 64.

The X-X' view illustrates self-aligned pillars 76.

The width 76 of each RMG 52 is equal between the fins of the first set of fins 18A and the width 76 of each RMG 52 is equal between the fins of the second set of fins 18B. Thus, there is an equal gate stack between the inner and outer edge of the fin. The device-to-device separation is thus larger to accommodate a work function metal (WFM) and isolation without impacting density. Moreover, every fin views the same WFM stack.

As a result, the variable FIN pitch with the self-aligned isolation pillar enables the closer positioning of fins of adjacent devices. Thus, FIN pitches of less than 36 nm can be achieved.

In conclusion, the exemplary embodiments form a variable FIN pitch VFET with robust replacement metal gate process with self-aligned isolation. The exemplary integrated circuit (IC) includes vertical transistors (VFETs) having devices with variable FIN pitch, an isolation structure formed substantially in the middle between the FINs with wider pitch, merged bottom S/D epi and merged top S/D epi for FINs with smaller pitch, and a gate stack thickness between FINs of smaller pitch is the same as a gate stack thickness between the FIN and the middle isolation structure. The exemplary method includes forming vertical FINs with hardmask and variable pitches, forming a sacrificial material to pinch-off small pitch while large pitch still has space in between, and the thickness of the sacrificial material between the FINs of smaller pitch is the same as the thickness of the sacrificial between the FIN and the said space. Further steps include forming self-isolation in the space, removing the FIN hardmask, recessing the sacrificial material to form a recessed sacrificial material gate pillar, forming a top spacer, merged top epi, and epi cap, forming a trench opening to expose the sacrificial material, removing the sacrificial material, and forming a replacement gate.

Regarding FIGS. 1-12, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties can include doping, such as doping transistor sources and drains, generally by diffusion and/or by ion implantation. These doping processes are followed by furnace annealing or by rapid thermal annealing (RTA). Annealing serves to activate the implanted dopants.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming a vertical field-effect-transistor (VFET) replacement meal gate (RMG) with a variable fin pitch and self-aligned isolation (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:
1. A semiconductor structure comprising:
a first set of fins and a second set of fins;
a dielectric pillar disposed between the first set of fins and the second set of fins such that the dielectric pillar extends above a topmost surface of the first and second set of fins;
a first bottom source/drain (S/D) region directly contacting a bottom surface of the first set of fins and a second bottom S/D region directly contacting a bottom surface of the second set of fins;
a first top S/D region directly contacting a top surface of the first set of fins and a second top S/D region directly contacting a top surface of the second set of fins, wherein sidewalls of the first and second top S/D regions directly contact sidewalls of the dielectric pillar, wherein the first set of fins have a first fin pitch and the second set of fins have a second fin pitch, the first fin pitch being different than the second fin pitch; and
gates disposed between the first set of fins and a second set of fins, the gates having a width between the first set of fins that is equal to a width of the gates between the second set of fins, wherein gates adjacent to the dielectric pillar directly contact the dielectric pillar.

2. The semiconductor structure of claim 1, wherein the gates include a high-k metal gate (HKMG).

3. The semiconductor structure of claim 2, wherein a width of the HKMG between a fin of the first set of fins and the dielectric pillar is equal to a width of the HKMG between a fin of the second set of fins and the dielectric pillar.

4. The semiconductor structure of claim 2, wherein the dielectric pillar extends above a top surface of the HKMG.

5. The semiconductor structure of claim 1, wherein a pitch between a fin of the first set of fins and a fin of the second set of fins is different than a pitch between fins of the first set of fins and different than a pitch between fins of the second set of fins.

6. A semiconductor structure comprising:
a first set of fins defining a plurality of first fins having a first pitch therebetween;
a second set of fins defining a plurality of second fins having a second pitch therebetween wherein the first pitch is different than the second pitch;
a dielectric pillar disposed between the first set of fins and the second set of fins such that the dielectric pillar extends above a topmost surface of the first and second set of fins; and
high-k metal gates (HKMGs) disposed between the first set of fins and between the second set of fins, the HKMGs having a width between the first set of fins that is equal to a width of the gates between the second set of fins, wherein a third pitch is defined between a first fin of the plurality of first fins adjacent the dielectric pillar and a second fin of the plurality of second fins adjacent the dielectric pillar, wherein HKMGs adjacent to the dielectric pillar directly contact the dielectric pillar.

7. The semiconductor structure of claim 6, wherein a width of the HKMGs between a first fin of the first set of fins and the dielectric pillar is equal to a width of the HKMGs between a second fin of the second set of fins and the dielectric pillar.

* * * * *